United States Patent
Uesaka (10) Patent No.: US 6,470,282 B1
(45) Date of Patent: Oct. 22, 2002

(54) ELECTROMAGNETIC WAVE SOURCE PROBING DEVICE AND PROBING METHOD WITH THE PROBING DEVICE

(75) Inventor: Kouichi Uesaka, Kawasaki (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/292,951

(22) Filed: Apr. 16, 1999

(30) Foreign Application Priority Data

Apr. 17, 1998 (JP) .......................................... 10-107307

(51) Int. Cl.⁷ .............................................. G01R 27/00
(52) U.S. Cl. ........................... 702/57; 702/65; 324/635; 324/636
(58) Field of Search ........................ 702/57, 69, 74–79, 702/94, 189–191; 324/632, 635, 636, 639, 627, 628, 346–348

(56) References Cited

U.S. PATENT DOCUMENTS

| | | | |
|---|---|---|---|
| 4,095,169 A | * 6/1978 | Musé | ......................... 324/345 |
| 4,943,778 A | * 7/1990 | Osaki | ......................... 324/636 |
| 5,057,781 A | * 10/1991 | Atkins et al. | ............... 324/635 |
| 5,218,301 A | * 6/1993 | Kuckes | ........................ 324/346 |
| 5,280,173 A | * 1/1994 | Morse et al. | ............. 324/244.1 |
| 5,300,879 A | 4/1994 | Masuda et al. | |
| 5,436,448 A | 7/1995 | Hosaka et al. | |
| 5,440,226 A | * 8/1995 | Blanpain et al. | ............. 324/348 |
| 5,495,849 A | 3/1996 | Hayashi et al. | |
| 5,514,971 A | * 5/1996 | Hankui et al. | .............. 324/639 |

FOREIGN PATENT DOCUMENTS

| | | |
|---|---|---|
| CA | 2001745 | 4/1990 |
| DE | 4226413 | 2/1993 |
| WO | 96/39076 | 12/1996 |

OTHER PUBLICATIONS

Kensuke Sekihara et al, "Reconstructing Current Distributions from Biomagnetic Measurements under Biomagnetic Measurements under Large External Noise Disturbances", IEEE Transactions on Medical Imagining, vol. 13, No. 1, Mar. 1994, pp. 144–151.

NEC, vol. 46, No. 9, 1993, "Electromagnetic Field Measurement and Numerical Analysis for EMC Problems", S. Hayashi. (pp. 50–54).

"A Proposal for Searching for Electromagnetic Wave Sources by Using a Synthetic Aperture Technique", J. Kikuchi et al, pp. 1194–1200. (No date).

"Search for Electromagnetic Wave Sources by Using the Maximum Entropy Method", J. Kikuchi et al, pp. 949–957, (No date).

* cited by examiner

Primary Examiner—Bryan Bui
(74) Attorney, Agent, or Firm—Mattingly, Stanger & Malur, P.C.

(57) ABSTRACT

A quite novel electromagnetic wave source probing device and a method with such a device in which the probing time can be shortened. Magnetic field to time characteristics generated from a subject to be measured are measured in a plurality of positions. Electric field to frequency characteristics generated from the subject to be measured are calculated by use of the plurality of measured magnetic field to time characteristics. Frequency components exceeding a predetermined electric field value are extracted in the calculated electric field to frequency characteristics. Positions where currents having the extracted frequency components exist in the subject to be measured are outputted.

14 Claims, 4 Drawing Sheets

ELECTROMAGNETIC WAVE SOURCE PROBING DEVICE AND PROBING METHOD WITH THE PROBING DEVICE

BACKGROUND OF THE INVENTION

The present invention relates to a method and a device for probing a source of electromagnetic waves generated from electronic equipment or the like, and particularly relates to a method and a device adapted for probing a source of electromagnetic waves in a short time.

In the unnecessary electromagnetic radiation control technique, electromagnetic interference occurs frequently as information/communication equipment and so on come into wide use recently, and technique for detecting a source of electromagnetic waves causing the interference is required. As for the system for probing a source of electromagnetic waves, there are papers, for example, by Junichi Kikuchi, "A Suggestion for a Method of Estimating the Position of a Source of Electromagnetic Waves by Aperture Combination", IEICE (the Institute of Electronics, Information and Communication Engineers of Japan), Transactions B-IJ, October 1985; Junichi Kikuchi, "Positional Estimation of a Source of Electromagnetic Waves with Maximum Entropy Method", IEICE Transactions B-II, September 1986; Masayo Hayashi, "Electromagnetic Field Measurement and Numerical Analysis in EMC", NEC Technical Report, September 1993; etc.

Figure 5:
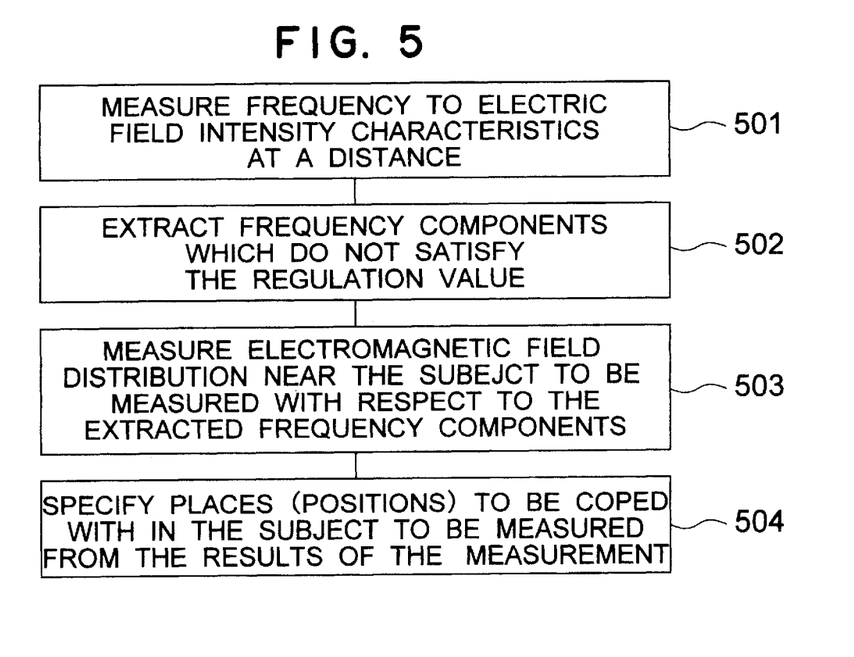
FIG. 5 is a flow chart showing a conventional procedure of processing.

FIG. 5 shows such a conventional method for probing a source of electromagnetic waves.

First, in the conventional probing method, frequency to electric field intensity characteristics E(f) at a distance of 3 m or 10 m which was a target of legal controls was measured (Step 501), and frequency components which did not satisfy a regulation value were extracted from the results of the measurement (Step 502). Electromagnetic field distribution near a subject to be measured was measured with respect to the extracted frequency components (Step 503), and places (positions) to be coped with in the subject to be measured were specified from the results of the measurement (Step 504).

It was therefore necessary to measure both the distant field and the near field before the places to be coped with were specified. In addition, when there were many frequency components which did not satisfy the regulation value, it was necessary to measure electromagnetic field distribution near the subject to be measured corresponding to the number of the frequency components which did not satisfy the regulation value. Accordingly, there was a problem that the whole probing period of time was prolonged.

SUMMARY OF THE INVENTION

It is therefore an object of the present invention to provide a quite novel electromagnetic wave source probing device and a method thereof, in which the probing time can be shortened. That is, it is an object of the present invention to provide an electromagnetic wave source probing device and a method thereof, in which it is not necessary to perform conventional measurement of electromagnetic field strength distribution near a subject to be measured with respect to respective frequency components.

In order to attain the foregoing object, according to the present invention, prospect is performed by using a near magnetic field measured value H(t) in time domain, differently from a conventional prospect by using a distant electric field measured value E(f) in frequency domain.

More specifically, according to an aspect of the present invention, provided is an electromagnetic wave source probing method comprising the steps of: measuring magnetic field to time characteristics generated from a subject to be measured in a plurality of positions; calculating electric field to frequency characteristics generated from the subject to be measured by use of the plurality of measured magnetic field to time characteristics; extracting frequency components exceeding a predetermined electric field value in the calculated electric field to frequency characteristics; and outputting positions where currents having the extracted frequency components exist in the subject to be measured.

According to another aspect of the present invention, provided is an electromagnetic wave source probing device comprising: a plurality of measuring means for measuring magnetic field to time characteristics generated from a subject to be measured; a first calculating means for calculating electric field to frequency characteristics generated from the subject to be measured based on the magnetic field to time characteristics measured by the plurality of measuring means; a second calculating means for calculating frequency components exceeding a predetermined electric field value in the calculated electric field to frequency characteristics; and an output means for outputting positions where currents having the calculated frequency components exist in the subject to be measured.

In such a manner, it is not necessary to measure both the distant field and the near field, unlike a conventional case, before places to be coped with are specified, but it will go well if only the near field is measured. It is therefore possible to shorten the prospect time. Particularly, even if there are many frequency components which do not satisfy the regulation value, it is not necessary to measure electromagnetic field distribution near the subject to be measured corresponding to the number of the frequency components unlike the conventional case, and the places to be coped with can be specified simply by a calculation process simply. It is therefore possible to shorten the probing time on a large scale.

DETAILED DESCRIPTION OF THE EMBODIMENT

An embodiment of the present invention will be described in detail below with reference to the drawings.

Figure 1:
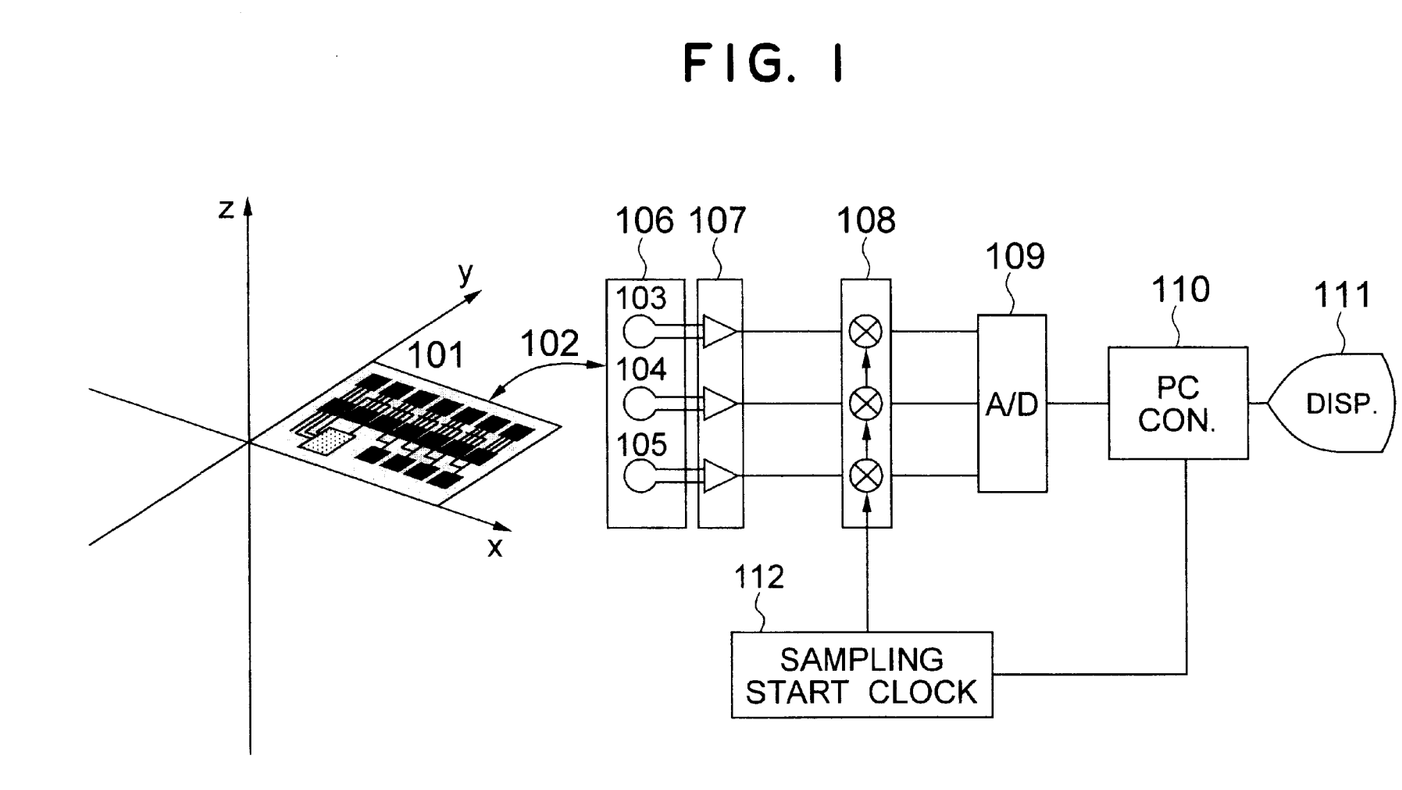
FIG. 1 is a diagram illustrating the configuration of an electromagnetic wave source probing device according to the present invention.

FIG. 1 shows the system configuration of the embodiment.

In FIG. 1, the reference numeral 101 represents a subject to be measured; 106, a three-dimensional magnetic field probe in which an x-direction magnetic field probe 103, a y-direction magnetic field probe 104 and a z-direction magnetic field probe 105 are combined; 107, a high-frequency amplifier; 108, a phase detector; 109, an A/D converter; 110, an arithmetic computer; and 112, a sampling start clock for supplying a clock to the phase detector 108. In a direct probing system, there would arise influence of a mirror image caused by a measuring device. Accordingly, in this embodiment, in order to reduce this influence, a distance is set between a measuring device body and a subject to be measured, and only the magnetic field probe which is small enough not to disturb the magnetic field is extended from the measuring device body to the subject to be measured. Then, measurement is performed.

The three-dimensional magnetic field probe 106 is constituted by three loop antennas 103, 104 and 105. The loop antennas 103, 104 and 105 are disposed so that their loop surfaces are directed in the X-direction, the Y-direction and the Z-direction respectively. With the loop antennas, magnetic field intensity can be measured by induction voltage induced in the loop antennas. In addition, the three-dimensional magnetic field probe 106 is disposed at a point which is apart from the subject to be measured 101 by a distance 102. For example, the three-dimensional magnetic field probe 106 is disposed so as to be very close to the subject to be measured 101, that is, at a distance of about 1 cm. In addition, though not shown, a plurality of three-dimensional magnetic field probes 106 are arranged at intervals of about 1 cm in the longitudinal and transverse directions so as to cover the subject to be measured 101. That is, the three-dimensional magnetic field probes 106 are arranged in the form of a so-called lattice.

Next, the operation in this system will be described.

First, when measurement is started, the three-dimensional magnetic field probe 106 in which the x-direction magnetic field probe 103, the y-direction magnetic field probe 104 and the z-direction magnetic field probe 105 are combined detects a magnetic field generated from the subject to be measured 101. That is, the three-dimensional magnetic field probe 106 detects induction voltages which are changed by magnetic flux passing through the loop antennas 103 to 105 respectively. The detected induction voltages are amplified by the high-frequency amplifier 107, and applied to the phase detector 108. At that time, the loop antennas 103 to 105 detect the induction voltages in the form of time waveforms.

A clock synchronized with the cycle operation period of the subject to be measured 101 is supplied from the sampling start clock 112 to the phase detector 108. The phase detector 108 samples the time waveforms of the above-mentioned induction voltages on the basis of this clock. Consequently, it is possible to obtain information of size and phase about the induction voltages. Here, the time to measure the induction voltages is made to be not shorter than 1/fs [sec] where fs [Hz] designates a lower limit frequency to be probed. In addition, sampling frequency of the time waveform required for probing is made to be not shorter than 2 fe [Hz] where fe [Hz] designates an upper limit frequency to be probed. These are conditions on the basis of general sampling theorem.

Next, signals about the information of the size and phase of the sampled induction voltages are A/D converted by the A/D converter 109. The converted signals are read by the arithmetic computer 110. The arithmetic computer 110 converts this information about the induction voltages into information about magnetic field by use of a predetermined transformation to thereby obtain magnetic field to time characteristics H(t).

Figure 4:
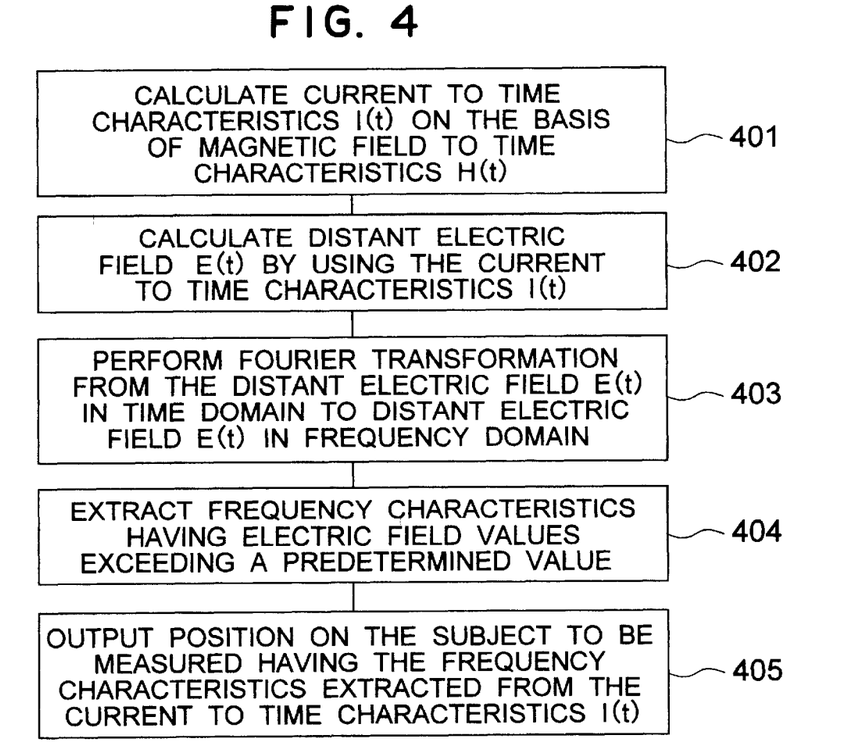
FIG. 4 is a flow chart showing a procedure of processing in this system.

FIG. 4 shows a method in which this time information (magnetic field to time characteristics H(t)) about magnetic field is used for probing a source of electromagnetic waves in a subject to be measured. This processing is also performed by the arithmetic computer 110.

First, current to time characteristics I(t) on the subject to be measured are calculated on the basis of the above-mentioned magnetic field to time characteristics H(t) (practically on the basis of the intensity of the magnetic field per sampling time) (Step 401). For example, the current to time characteristics I(t) on the subject to be measured are calculated on the basis of the magnetic field to time characteristics H(t) by use of the fact that an electric current Ix(n) existing in the subject to be measured, and calculated values Hx, y, z x, y, z (m, n) and measured values Hmx, y, z (m) of a neighbor magnetic field generated by the current Ix(n) have a relation of Expression 1. In the term "Hx, y, z x, y, z (m, n)", x, y and z adjacent to H on the right designate directional components of a magnetic field; x, y and z adjacent to these x, y and z on the right designate directional components of an assumed electric current, and (m, n) designate a position where the magnetic field is measured and a position where the current is assumed. On the other hand, in the term "Hmx, y, z (m)", Hm designates a measured value; x, y and z adjacent thereto on the right designate directional components of the magnetic field; and (m) designates a position where the magnetic field is measured.

$$\begin{pmatrix} Hm_x(m) \\ Hm_y(m) \\ Hm_z(m) \end{pmatrix} = \begin{pmatrix} Hx_x(m,n), Hx_y(m,n), Hx_z(m,n) \\ Hy_x(m,n), Hy_y(m,n), Hy_z(m,n) \\ Hz_x(m,n), Hz_y(m,n), Hz_z(m,n) \end{pmatrix} \cdot \begin{pmatrix} I_x(n) \\ I_y(n) \\ I_z(n) \end{pmatrix}$$

Expression 1

That is, the simultaneous equations of Expression 1 are solved by using the data per sampling time, so that the current to time characteristics I(t) on the subject to be measured are calculated on the basis of the magnetic field to time characteristics H(t).

The calculated current to time characteristics I(t) and the position on the subject to be measured are stored in association with each other.

Next, the current to time characteristics I(t) are regarded as a source of micro-dipole waves in a position on the subject to be measured, and an electric field E(t) in a position at a distance which is a target of legal controls or the like is calculated (Step 402). For example, a distant electric field in a position at a distance of 3 m from the subject to be measured is calculated.

Next, Fourier transformation is performed on the basis of the distant electric field E(t) in time domain to a distant electric field E(f) in frequency domain (Step 403).

Through the above processing, the electric field to frequency characteristics E(f) can be obtained on the basis of the magnetic field to time characteristics H(t). Then, of the electric field to frequency characteristics E(f) obtained thus, frequency characteristics in which an electric field value exceeds a setting value are extracted (Step 404).

Finally, current to time characteristics I(t) having the extracted frequency characteristics are concluded on the basis of the above-mentioned stored information about the current to time characteristics I(t) and a position on the subject to be measured, and a fitted position on the subject to be measured is outputted (Step 405).

From this result, it is possible to obtain the magnitude, phase and position of a current acting a source of electromagnetic waves in the subject to be measured, which is a predominant factor of the electromagnetic waves 1 in the distance. Based on this, a measure to control the electromagnetic waves is taken.

In such a manner, magnetic field to time characteristics generated from a subject to be measured are measured in a plurality of positions, and the plurality of measured magnetic field to time characteristics are used to calculate electric field to frequency characteristics generated from the subject to be measured. In addition, positions in question in the subject to be measured are also detected by calculation on the basis of the measured magnetic field to time characteristics. Accordingly, it is not necessary to measure both the distant field and the near field as in the conventional case, and it is possible to shorten the probing time. Particularly, even if there is a large number of frequency components which do not satisfy a regulation value, it is not necessary to measure electromagnetic field distribution near the subject to be measured in accordance with the number of these frequency components as in the conventional case, but it is possible to obtain the places to be coped with by calculation simply. It is therefore possible to shorten the probing time on a large scale.

Next, another example for calculating current distribution on the basis of the magnetic field to time characteristics H(t) described in the above-mentioned flow chart will be described.

Figure 2:
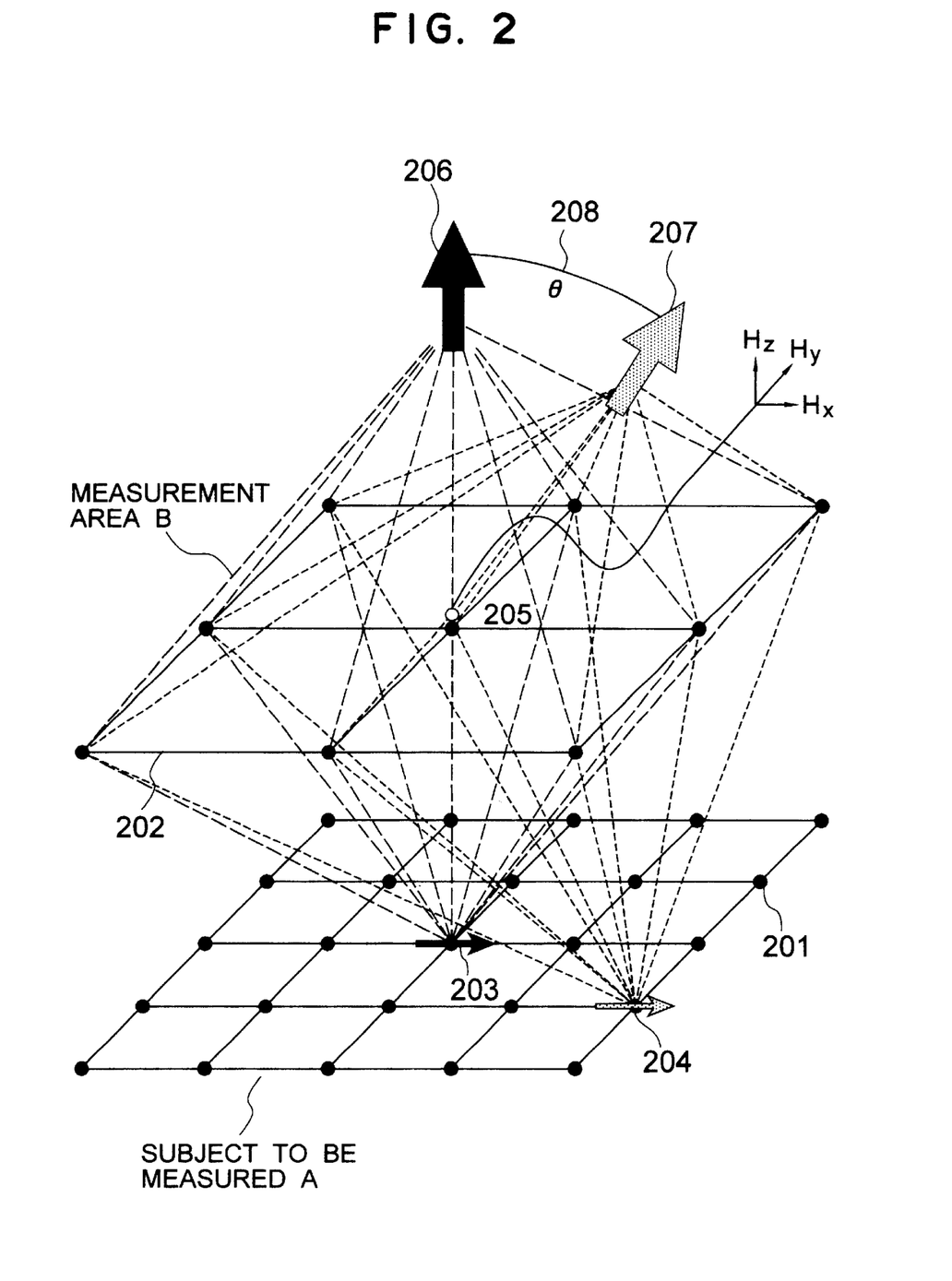
FIG. 2 is a conceptual diagram of a back-calculation system for an electromagnetic wave source according to the present invention.

First, the concept of this example will be described. FIG. 2 is a diagram showing the concept. In FIG. 2, very small lattice points (201, 203, 204, and so on) in which an electric current is assumed to exist are established in a subject to be measured A, and very small lattice points (205 and so on) in which a magnetic field generated from the subject to be measured A is measured are established in a measurement area B.

In FIG. 2, the reference numeral 201 represents a lattice point where an electric current is assumed to exist; 202, a lattice point where a magnetic field is measured; 203, a lattice point where an electric current exists actually; 204, a lattice point where an electric current is assumed to exist; 205, a three-dimensional probe for measuring a magnetic field; 206, a measured magnetic field composite complex vector obtained by measurement; 207, a calculated magnetic field composite complex vector obtained by calculation; and 208, an angle between the measured magnetic field composite complex vector 206 and the calculated magnetic field composite complex vector 207.

In this calculation system, magnetic field distribution when a predetermined current exists in each lattice point of the subject to be measured A is obtained by calculation, and it is judged whether this obtained result (the calculated magnetic field composite complex vector 207) coincides with an actually measured value (the measured magnetic field composite complex vector 206) within an allowable range. If they are coincide, an electric current is regarded as existing in the lattice point, and current distribution (position and magnitude) is calculated per sampling time. The coincidence is judged by using the angle 208 between the measured magnetic field composite complex vector 206 and the calculated magnetic field composite complex vector 207.

Description will be made about a function used for this calculation.

On the assumption that x, y and z directional components Ix, Iy and Iz of a current exist in a very small lattice point n of the subject to be measured A, vector potential A in a very small lattice point m in the measurement area B can be expressed as a function of time t as shown in Expression 2.

$$A(t) = \frac{1}{2\pi}\int_{-\infty}^{\infty} A(w)e^{-j\omega t}\,d\omega \cong \frac{1}{2\pi}\sum_{f=0}^{fe} A(2\pi f)e^{-j2\pi f\,dt}\Delta f \quad\quad \text{Expression 2}$$

$$A(\omega) = \frac{1}{4\pi}\int \frac{J}{r}e^{-jkr}\,dv$$

Here, J designates current density; ω, an angular frequency; fe, an upper limit of a frequency band which is a target of measurement; and rmn, a distance between the lattice point m and the lattice point n.

From Maxwell's equations shown in Expression 3, this Expression 2 can be expressed as a function of time t with respect to a magnetic field shown in Expression 4. Magnetic field distribution at each lattice point in the measurement area B is calculated with this Expression 4. Then, Expression 4 is derived on the assumption that a pulse current having a magnitude of 1 and a phase of 0 exists in respective directions of XYZ coordinate systems at each lattice point in the subject to be measured A. With this assumed current, Expression 4 obtains magnetic field distribution generated at each lattice point (measurement point) in the measurement area. Here, time terms of the current are omitted for simplification.

$$H = \nabla \times A \quad\quad \text{Expression 3}$$

$$Hm_x(m, t) = \sum_{n=1}^{N} \{Hx_y(m, n, t)Iy(n) + Hx_z(mn, t)Iz(n)\} \quad \text{Expression 4}$$

$$Hm_y(m, t) = \sum_{n=1}^{N} \{Hy_z(m, n, t)Iz(n) + Hy_x(m, n, t)Ix(n)\}$$

$$Hm_z(m, t) = \sum_{n=1}^{N} \{Hz_x(m, n, t)Ix(n) + Hz_y(m, n, t)Iy(n)\}$$

Upon the magnetic field distribution calculated with Expression 4 and the measured magnetic field distribution in the XYZ coordinate directions at each lattice point in the measurement area B, complex vectors having a number of dimensions equal to the number of lattices associated with the respective magnetic field distribution are established, and an arithmetic operation as shown in Expression 5 is carried out upon each term of these complex vectors. That is, the inner product of the both complex vectors is obtained.

$$\sum_{m=1}^{M} Hm_z(m, t) \cdot Hx_y(m, n', t) = \quad\quad \text{Expression 5}$$

$$\sum_{m=1}^{M}\sum_{n=1}^{N} \{Hx_y(m, n, t) \cdot Iy(n) \cdot Hx_y(m, n', t) +$$

$$Hx_z(m, n, t) \cdot Iz(n) \cdot Hx_y(m, n', t)\}$$

$$\sum_{m=1}^{M} Hm_x(m, t) \cdot Hx_z(m, n', t) =$$

$$\sum_{m=1}^{M}\sum_{n=1}^{N} \{Hx_y(m, n, t) \cdot Iy(n) \cdot Hx_z(m, n', t) +$$

$$Hx_z(m, n, t) \cdot Iz(n) \cdot Hx_x(m, n', t)\}$$

-continued $$\sum_{m=1}^{M} Hm_y(m,t) \cdot Hy_z(m,n',t) =$$

$$\sum_{m=1}^{M}\sum_{n=1}^{N} \{\underline{Hy_z(m,n,t) \cdot Iz(n) \cdot Hy_z(m,n',t)} + Hy_x(m,n,t) \cdot Ix(n) \cdot Hy_z(m,n',t)\}$$

$$\sum_{m=1}^{M} Hm_y(m,t) \cdot Hy_x(m,n',t) =$$

$$\sum_{m=1}^{M}\sum_{n=1}^{N} \{Hy_z(m,n,t) \cdot Iz(n) \cdot Hy_z(m,n',t) + \underline{Hy_z(m,n,t) \cdot Ix(n) \cdot Hy_x(m,n',t)}\}$$

$$\sum_{m=1}^{M} Hm_z(m,t) \cdot Hz_z(m,n',t) =$$

$$\sum_{m=1}^{M}\sum_{n=1}^{N} \{\underline{Hz_x(m,n,t) \cdot Ix(n) \cdot Hz_x(m,n',t)} + Hz_y(m,n,t) \cdot Iy(n) \cdot Hz_x(m,n',t)\}$$

$$\sum_{m=1}^{M} Hm_z(m,t) \cdot Hz_y(m,n',t) =$$

$$\sum_{m=1}^{M}\sum_{n=1}^{N} \{Hz_x(m,n,t) \cdot Ix(n) \cdot Hz_y(m,n',t) + \underline{Hz_y(m,n,t) \cdot Iy(n) \cdot Hz_y(m,n',t)}\}$$

Here, n' designates a lattice point where the assumed unit current exists in the subject to be measured A.

If two equations where current components contained in the underlined portions in Expression 5 are equal to each other are picked up and the inner product of these equations is obtained as follows.

Expression 6

$$\sum_{m=1}^{M} Hm_y(m,t) \cdot Hy_x(m,n',t) \cdot$$

$$\sum_{m=1}^{M} Hm_x(m,t) \cdot H_{z_x}(m,n',t) =$$

$$\sum_{m=1}^{M}\sum_{n=1}^{N} [\{Hy_z(m,n,t) \cdot Iz(n) \cdot Hy_x(m,n',t) +$$

$$Hy_x(m,n,t) \cdot Ix(n) \cdot Hy_z(m,n',t)\} \cdot$$

$$\{Hz_x(m,n,t) \cdot Ix(n) \cdot Hz_x(m,n',t) +$$

$$Hz_y(m,n,t) \cdot Iy(n) \cdot Hz_x(m,n',t)\} =$$

$$\sum_{m=1}^{M}\sum_{n=1}^{N} \{Hy_z(m,n,t) \cdot Iz(n) \cdot Hy_x(m,n',t) \cdot$$

$$Hz_x(m,n,t) \cdot Ix(n) \cdot Hz_x(m,n',t) +$$

$$Hy_z(m,n,t) \cdot Iz(n) \cdot Hy_x(m,n',t) \cdot$$

$$Hz_y(m,n,t) \cdot Iy(n) \cdot Hz_x(m,n',t) +$$

$$Hy_x(m,n,t) \cdot Ix(n) \cdot Hy_z(m,n',t) \cdot$$

$$Hz_x(m,n,t) \cdot Ix(n) \cdot Hz_x(m,n',t) +$$

$$Hy_x(m,n,t) \cdot Ix(n) \cdot Hy_z(m,n',t) \cdot$$

-continued $$Hz_y(m,n,t) \cdot Iy(n) \cdot Hz_x(m,n',t)\} =$$

$$\sum_{m=1}^{M}\sum_{n=1}^{N} \{Hy_z(m,n,t) \cdot Iz(n) \cdot Hy_x(m,n',t) \cdot H z_x(m,n,t) \cdot Ix(n) \cdot Hz_x(m,n',t)\} +$$

$$\sum_{m=1}^{M}\sum_{n=1}^{N} \{Hy_z(m,n,t) \cdot Iz(n) \cdot Hy_x(m,n',t) \cdot H z_y(m,n,t) \cdot Iy(n) \cdot Hz_x(m,n',t)\} +$$

$$\sum_{m=1}^{M}\sum_{n=1}^{N} \{Hy_x(m,n,t) \cdot Ix(n) \cdot Hy_x(m,n',t) \cdot H z_x(m,n,t) \cdot Ix(n) \cdot Hz_x(m,n',t)\} +$$

$$\sum_{m=1}^{M}\sum_{n=1}^{N} \{Hy_x(m,n,t) \cdot Ix(n) \cdot Hy_x(m,n',t) \cdot H z_y(m,n,t) \cdot Iy(n) \cdot Hz_x(m,n',t)\}$$

On the other hand, if the position of a measured point in the measurement area B is provided to enclose a portion above the subject to be measured A which is a source of electromagnetic waves, the conditions of Expression 7 are established. As a result, the first term, the second term and the fourth term of Expression 6 become zero, so that Expression 6 can be simplified as shown in Expression 8.

Expression 7

$$\theta \leq \pm \arctan\left(\frac{\sqrt{X_p^2 + Y_p^2}}{(Z_p - Z_s)}\right) = \pm\theta'$$

$$\phi \leq \pm 180°$$

$$\sum_{m=1}^{M}\sum_{n=1}^{N} = \int_{-\theta'}^{+\theta'}\int_{-180°}^{+180°} d\phi d\theta$$

Expression 8

$$\sum_{m=1}^{M} Hm_y(m,t) \cdot Hy_x(m,n',t) \cdot$$

$$\sum_{m=1}^{M} Hm_x(m,t) \cdot Hz_x(m,n',t) =$$

$$\sum_{m=1}^{M}\sum_{n=1}^{N} \{Hy_x(m,n,t) \cdot Ix(n) \cdot Hy_x(m,n',t) \cdot$$

$$Hz_x(m,n,t) \cdot Ix(n) \cdot Hz_x(m,n',t)\}$$

Similarly, other components of the XYZ coordinate systems can be also expressed as shown in Expression 9.

Expression 9

$$\sum_{m=1}^{M} Hm_x(m,t) \cdot Hx_y(m,n',t) \cdot$$

$$\sum_{m=1}^{M} Hm_x(m,t) \cdot Hz_y(m,n',t) =$$

$$\sum_{m=1}^{M}\sum_{n=1}^{N} \{Hx_y(m,n,t) \cdot Iy(n) \cdot Hx_y(m,n',t) \cdot$$

-continued $$\sum_{m=1}^{M} Hm_x(m, t) \cdot Hx_x(m, n', t) \cdot$$

$$Hz_y(m, n, t) \cdot Iy(n) \cdot Hz_y(m, n', t)\}$$

$$\sum_{m=1}^{M} Hm_y(m, t) \cdot Hy_x(m, n', t) =$$

$$\sum_{m=1}^{M} \sum_{n=1}^{N} \{Hx_x(m, n, t) \cdot Iz(n) \cdot Hx_x(m, n', t) \cdot$$

$$Hy_x(m, n, t) \cdot Iz(n) \cdot Hy_x(m, n', t)\}$$

Since the Expressions 8 and 9 express inner products respectively, if these inner products are divided by the magnitudes of the complex vectors corresponding to the above-mentioned measured value and calculated value, it is possible to calculate the matching degree (cos θ) between the magnetic field distribution (calculated value) and the magnetic field distribution (measured value) can be calculated. This is a probability (or ratio) in which a source of electromagnetic waves (an electric current) exists in each lattice point in the subject to be measured A. Accordingly, it is possible to conclude that an electric current exists in the lattice point if the matching degree is large.

This probability of existence of an electric current is expressed by Expression 10.

$$\cos\theta_{(Ix(n))} = \sqrt{\frac{\sum_{m=1}^{M}\{Hm_y(m,t)\cdot Hy_x(m,n,t)\}\cdot}{\sum_{m=1}^{M}\{Hm_x(m,t)\cdot Hz_x(m,n,t)\}}{\sum_{m=1}^{M}\sum_{n=1}^{N}\{Hy_x(m,n,t)^2\cdot Hz_x(m,n,t)^2\}}}$$

$$= \sqrt{\frac{|Hm_y(m,t)\cdot Hy_x(m,n,t)|\cdot |Hm_x(m,t)\cdot Hz_x(m,n,t)|}{|Hy_x(m,n,t)|^2\cdot |Hz_x(m,n,t)|^2}}$$

Expression 10

$$\cos\theta_{(Iy(n))} = \sqrt{\frac{\sum_{m=1}^{M}\{Hm_x(m,t)\cdot Hz_y(m,n,t)\}\cdot}{\sum_{m=1}^{M}\{Hm_x(m,t)\cdot Hx_y(m,n,t)\}}{\sum_{m=1}^{M}\sum_{n=1}^{N}\{Hz_y(m,n,t)^2\cdot Hx_y(m,n,t)^2\}}}$$

$$= \sqrt{\frac{|Hm_x(m,t)\cdot Hz_x(m,n,t)|\cdot |Hm_x(m,t)\cdot Hx_y(m,n,t)|}{|Hz_y(m,n,t)|^2\cdot |Hx_y(m,n,t)|^2}}$$

$$\cos\theta_{(Ix(n))} = \sqrt{\frac{\sum_{m=1}^{M}\{Hm_x(m,t)\cdot Hx_x(m,n,t)\}\cdot}{\sum_{m=1}^{M}\{Hm_y(m,t)\cdot Hy_x(m,n,t)\}}{\sum_{m=1}^{M}\sum_{n=1}^{N}\{Hy_x(m,n,t)^2\cdot Hx_x(m,n,t)^2\}}}$$

$$= \sqrt{\frac{|Hm_x(m,t)\cdot Hx_x(m,n,t)|\cdot |Hm_y(m,t)\cdot Hy_x(m,n,t)|}{|Hy_x(m,n,t)|^2\cdot |Hx_x(m,n,t)|^2}}$$

If the matching degree (cos θ) satisfies the conditions shown in Expression 11, an electric current is regarded as existing at the lattice point, and the value following "then" is calculated. If the matching degree (cos θ) does not satisfy the conditions, an electric current is regarded as not existing at the lattice point, and an arithmetic operation to make the value following "else" be 0 is performed.

If $\cos\theta_{(Ix(n'))} \geq \dfrac{dx/2}{\sqrt{(dx/2)^2 + (z_p - z_s)^2}}$ then $Ix(n') =$  Expression 11

$\sqrt{\dfrac{Hm_x(m,t)}{Hy_x(m,n,t')} \cdot \dfrac{Hm_x(m,t)}{Hz_x(m,n,t')}}$ else $Ix(n') = 0$ If $\cos\theta_{(Iy(n'))} \geq \dfrac{dy/2}{\sqrt{(dy/2)^2 + (z_p - z_s)^2}}$ then $Iy(n') =$ $\sqrt{\dfrac{Hm_x(m,t)}{Hz_Y(m,n,t')} \cdot \dfrac{Hm_x(m,t)}{Hx_y(m,n,t')}}$ else $Iy(n') = 0$ If $\cos\theta_{(Ix(n'))} \geq \dfrac{dx/2}{\sqrt{(dx/2)^2 + (z_p - z_s)^2}}$ then $Iz(n') =$ $\sqrt{\dfrac{Hm_x(m,t)}{Hx_x(m,n,t')} \cdot \dfrac{Hm_y(m,t)}{Hy_x(m,n,t')}}$ else $Iz(n') = 0$ Thus, by using calculated values and measured values about magnetic field distribution per sampling time, and Expressions 10 and 11, it is possible to calculate current to time characteristics I(t) on the basis of the above-mentioned magnetic field to time characteristics H(t).

This manner requires only calculation time proportional to the square of a lattice number (m, n) while the above-mentioned manner based on simultaneous equations requires calculation time proportional to the cube of the lattice number. Accordingly, it is possible to shorten the calculation time on a large scale.

Figure 3:
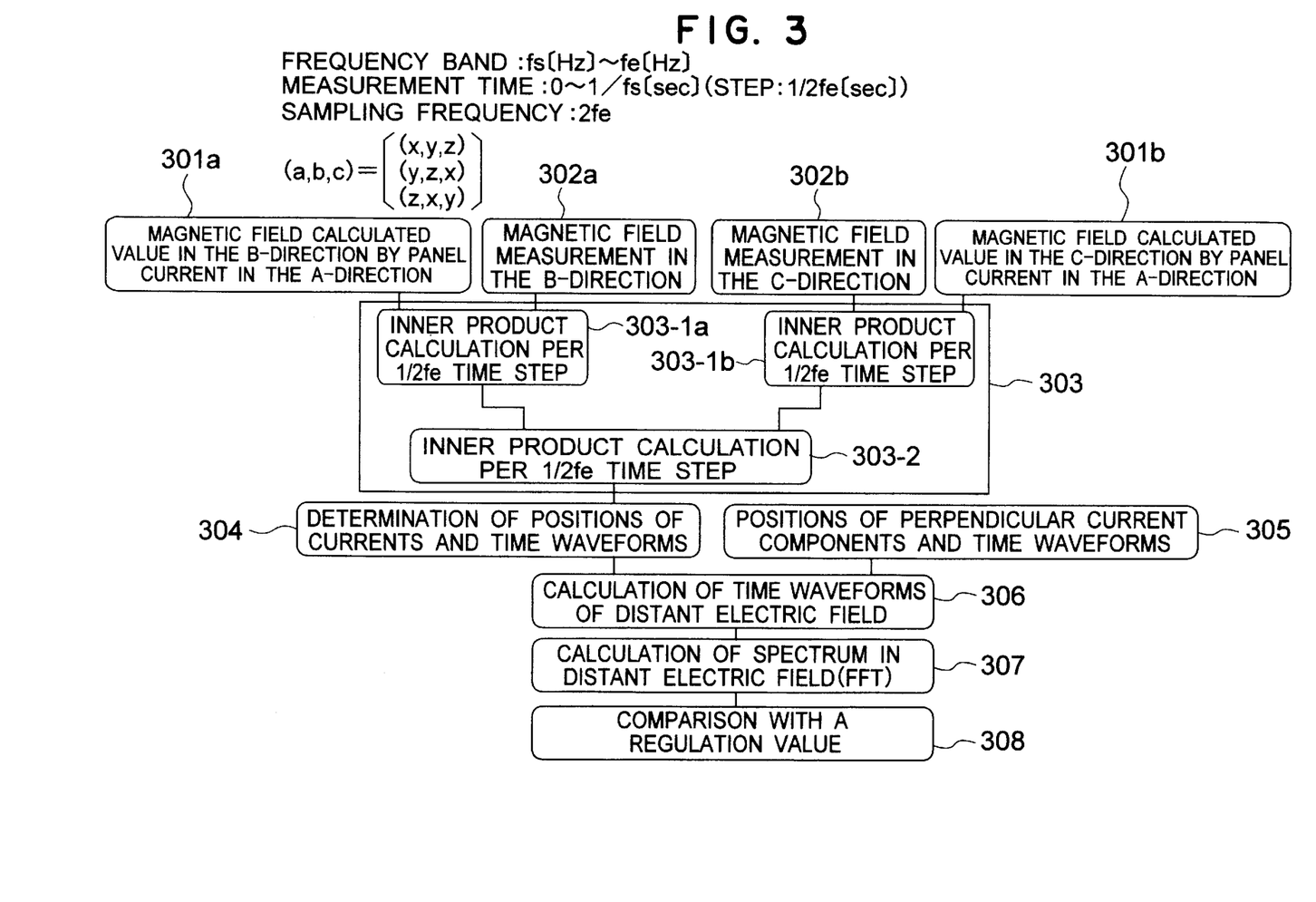
FIG. 3 is a flow chart of an electromagnetic wave source probing system according to the present invention.

FIG. 3 shows a flow chart which is actually processed with this concept.

Here, in the first sampling, a source of electromagnetic waves is probed. In the second and following samplings, an assumed pulse current is delayed in accordance with the sampling time. When the pulse current is delayed in accordance with the sampling frequency at the time of measurement in such a manner, it is possible to obtain the time waveform of an actual current. In FIG. 3, (a, b, c) is applied to all the cases of (x, y, z), (y, z, x) and (z, x, y). That is, an arithmetic operation is performed by replacing (a, b, c) by (x, y, z), (y, z, x) or (z, x, y). Also in the process of FIG. 3, lattice points on the subject to be measured A and lattice points in the measurement area B as shown in FIG. 2 are established.

Description will be made about the case where (a, b, c) is (x, y, z). A pulse current in the x-direction is assumed to exist at a lattice point which is on the subject to be measured A, and calculated values (Hyx(m, n, t) and Hzx(m, n, t)) of y-directional and z-directional magnetic fields perpendicular to this pulse current are calculated (Step 301a, b). This calculation is carried out upon each lattice point.

In addition, y-directional and z-directional magnetic fields (Hmy(m, t) and Hmz(m, t)) at a lattice point in the measurement area are measured (Step 302a, b). This measurement is carried out upon each lattice point.

By using these calculated values, measured values, and Expressions 10 and 11, lattice points (positions) where a current exists in the subject to be measured A and the current values of the lattice points are calculated (Step 303). That is, the probabilities (cos è) in which a current exists at each lattice point are calculated on the basis of Expression 11, and current values at the lattice points satisfying the conditions of cos θ shown in Expression 11 are calculated. The arithmetic operation of Expression 10 includes an arithmetic operation of the inner product between the calculated value 301a and the measured value 302a every time step of ½ fe (Step 303–1a), an arithmetic operation of the inner product between the calculated value 301b and the measured value 302b every time step of ½ fe (Step 303–1b), and an arithmetic operation of the inner product between the inner product arithmetic operation results (303–1a and 303–1b) (Step 303–2).

Such an arithmetic operation is performed upon measured values every sampling time step, so that the position of a source of electromagnetic waves and the time waveform of a current in the position are calculated (Step 304).

Further, a similar arithmetic operation is performed upon pulse currents which are assumed to exist in the respective x-, y- and z-directions, and the positions and time waveforms of perpendicular current components are used (Step 305). The time waveform of electric field intensity in a distance where the electric field intensity is controlled is calculated every sampling step (Step 306).

The calculated time waveform E(t) of the electric field intensity is Fourier-transformed from time domain to frequency domain, so that a spectrum E(f) in the distant electric field is calculated (Step 307).

By using the distant electric field spectrum E(f), comparison is made between electric field intensity in each frequency and a regulation value (Step 308). It is concluded which frequency components of electromagnetic waves generated by the subject to be measured exceed the regulation value.

The processing for the frequency components exceeding the regulation value is as mentioned above. Electric currents having the frequency components are calculated, and positions of lattice points where the currents exist are outputted.

In the above processing, it is not necessary to measure both the distant field and the near field as in the conventional case before places to be coped with are specified. In addition, even if there are many frequency components which do not satisfy the regulation value, it is not necessary to measure electromagnetic field distribution near the subject to be measured in accordance with the number of the frequency components as conventionally. It is therefore possible to shorten the probing time.

As described above, if the three-dimensional probes are disposed in an array to simultaneously measure the near magnetic field in the form of time waveforms at various measuring points so as not to produce a time difference between the measurement points, it is possible to make the sampling start clock 112 unnecessary. In this case, it will go well if the position and time waveform of a current as a source of electromagnetic waves on the subject to be measured are calculated on the basis of amplitudes (A1, A1, A2, . . . An) and time delays (t1, t2, . . . tn) of measured values.

In addition, although description has been made about a two-dimensional subject to be measured such as a circuit board, it is also possible to probe the frequency, magnitude, phase and position of a source of electromagnetic waves in a three-dimensional electronic apparatus if an assumed position of the source of electromagnetic waves is extended to a space occupied by the three-dimensional subject to be measured and calculation is made on such a space.

According to the present invention, it is not necessary to measure both the distant field and the near field as in the conventional case before places to be coped with are specified. In addition, even if there are many frequency components which do not satisfy the regulation value, it is not necessary to measure electromagnetic field distribution near the subject to be measured in accordance with the number of the frequency components as in the conventional case. It is therefore possible to shorten the probing time.

What is claimed is:

1. An electromagnetic wave source probing method comprising the steps of:

measuring magnetic field to time characteristics of an electromagnetic wave generated from a subject to be measured in a plurality of positions;

calculating electric field to frequency characteristics generated from said subject to be measured by use of said plurality of measured magnetic field to time characteristics;

extracting a frequency component exceeding a predetermined electric field value in said calculated electric field to frequency characteristics; and outputting a position where a current having said extracted frequency component exists in said subject to be measured.

2. An electromagnetic wave source probing method according to claim 1, wherein said electromagnetic wave used for measuring said magnetic field to time characteristics is not an electromagnetic wave externally applied to said subject.

3. An electromagnetic wave source probing method according to claim 1, wherein said electromagnetic wave is generated from said subject when current flows in a circuit of said subject by applying a voltage to said subject.

4. An electromagnetic wave source probing method according to claim 1, further comprising the step of calculating current to time characteristics in a plurality of positions from said plurality of magnetic field to time characteristics, and calculating electric field to frequency characteristics generated from said subject from said calculated current to time characteristics.

5. An electromagnetic wave source probing method according to claim 4, further comprising the step of calculating distant electric field to time characteristics remote from the measured positions from said current to time characteristics, and electric field to frequency characteristics generated from said subject are calculated from said measured distant electric field to time characteristics.

6. An electromagnetic wave source probing method according to claim 5, further comprising the step of calculating current to frequency characteristics by performing Fourier transformation from said calculated electric field to frequency characteristics, and thereby calculating the position where the current having said extracted frequency component exists in said subject.

7. An electromagnetic wave source probing method according to claim 1, wherein said electric field to frequency characteristics are characteristics at a legal-controlled distance from said subject.

8. An electromagnetic wave source probing device comprising:
   means for measuring magnetic field to time characteristics of an electromagnetic wave generated from a subject to be measured in a plurality of positions;
   means for calculating electric field to frequency characteristics generated from said subject to be measured by use of said plurality of measured magnetic field to time characteristics;
   means for extracting a frequency component exceeding a predetermined electric field value in said calculated electric field to frequency characteristics; and
   means for outputting a position where a current having said extracted frequency component exists in said subject to be measured.

9. An electromagnetic wave source probing device according to claim 8, wherein said electromagnetic wave used for measuring said magnetic field to time characteristics is not an electromagnetic wave externally applied to said subject.

10. An electromagnetic wave source probing device according to claim 8, wherein said electromagnetic wave is generated from said subject when a current flows in a circuit of said subject by applying a voltage to said subject.

11. An electromagnetic wave source probing device according to claim 8, further comprising means for calculating current to time characteristics in a plurality of positions from said plurality of magnetic field to time characteristics, and calculating electric field to frequency characteristics generated from said subject from said calculated current to time characteristics.

12. An electromagnetic wave source probing device according to claim 11, further comprising means for calculating distant electric field to time characteristics remote from the measured positions from said current to time characteristics, and calculating electric field to frequency characteristics generated from said subject from said measured distant electric field to time characteristics.

13. An electromagnetic wave source probing device according to claim 12, further comprising means for calculating current to frequency characteristics by performing Fourier transformation from said calculated electric field to frequency characteristics, and thereby calculating the position where the current having said extracted frequency component exists in said subject.

14. An electromagnetic wave source probing device according to claim 8, wherein said electric field to frequency characteristics are characteristics at a legal-controlled distance from said subject.

* * * * *